United States Patent
Kawaraya et al.

(10) Patent No.: US 7,511,298 B2
(45) Date of Patent: Mar. 31, 2009

(54) METHOD FOR FORMING SEMICONDUCTOR FILM AND USE OF SEMICONDUCTOR FILM

(75) Inventors: Masahide Kawaraya, Hiratsuka (JP); Iwao Hayashi, Hiratsuka (JP)

(73) Assignee: Kansai Paint Co., Ltd., Amagasaki-shi (JP)

( * ) Notice: Subject to any disclaimer, the term of this patent is extended or adjusted under 35 U.S.C. 154(b) by 0 days.

(21) Appl. No.: 10/530,475

(22) PCT Filed: Oct. 10, 2003

(86) PCT No.: PCT/JP03/13019

§ 371 (c)(1),
(2), (4) Date: Apr. 6, 2005

(87) PCT Pub. No.: WO2004/033756

PCT Pub. Date: Apr. 22, 2004

(65) Prior Publication Data

US 2006/0163566 A1     Jul. 27, 2006

(30) Foreign Application Priority Data

Oct. 10, 2002 (JP) ............... 2002-297385
Mar. 19, 2003 (JP) ............... 2003-075849

(51) Int. Cl.
*H01L 29/12* (2006.01)
(52) U.S. Cl. ............ 257/43; 257/613; 438/104; 438/479; 438/502
(58) Field of Classification Search .......... 438/82; 257/43, 613
See application file for complete search history.

(56) References Cited

U.S. PATENT DOCUMENTS

| 5,955,198 | A  | * | 9/1999  | Hashimoto et al. | 428/414 |
| 6,043,428 | A  | * | 3/2000  | Han et al.       | 136/263 |
| 6,228,796 | B1 | * | 5/2001  | Arakawa et al.   | 502/159 |
| 6,479,745 | B2 | * | 11/2002 | Yamanaka et al.  | 136/263 |
| 6,623,899 | B2 | * | 9/2003  | Takaya et al.    | 430/65  |
| 6,653,701 | B1 | * | 11/2003 | Yamazaki et al.  | 257/414 |
| 2001/0027806 | A1 | * | 10/2001 | Yamanaka et al. | 136/263 |
| 2002/0002112 | A1 | * | 1/2002  | Muramatsu       | 502/350 |
| 2002/0042343 | A1 | * | 4/2002  | Akui et al.     | 502/350 |
| 2002/0058737 | A1 | * | 5/2002  | Nishiwaki et al. | 524/431 |
| 2002/0134426 | A1 | * | 9/2002  | Chiba et al.    | 136/263 |
| 2002/0186469 | A1 | * | 12/2002 | Kawazu et al.   | 359/486 |
| 2003/0140963 | A1 | * | 7/2003  | Yamanaka et al. | 136/263 |
| 2003/0232185 | A1 | * | 12/2003 | Shimamura et al. | 428/323 |
| 2004/0159102 | A1 | * | 8/2004  | Toyomura et al. | 60/641.8 |
| 2004/0188682 | A1 | * | 9/2004  | Hirai           | 257/59  |
| 2004/0221888 | A1 | * | 11/2004 | Fukui et al.    | 136/263 |
| 2004/0238026 | A1 | * | 12/2004 | Miyoshi         | 136/263 |
| 2005/0072458 | A1 | * | 4/2005  | Goldstein       | 136/251 |
| 2005/0150545 | A1 | * | 7/2005  | Choi et al.     | 136/263 |
| 2005/0194040 | A1 | * | 9/2005  | Hirose          | 136/263 |

FOREIGN PATENT DOCUMENTS

| EP | 1 119 068   | 7/2001  |
| EP | 1 207 572   | 5/2002  |
| EP | 1 213 775   | 6/2002  |
| JP | 11-314030   | 11/1999 |
| JP | 2002-145615 | 5/2002  |
| JP | 2002-324591 | 11/2002 |

OTHER PUBLICATIONS

Supplementary European Search Report mailed Dec. 4, 2006 (3 pages).
H. Cachet et al.: "n-Si/SnO₂ junctions based on macroporous silicon for photoconversion," *Solar Energy Materials and Solar Cells*, Elsevier Science Publishers, Amsterdam, NL, vol. 46, No. 2, May 1997, pp. 101-114.

* cited by examiner

*Primary Examiner*—Matthew Smith
*Assistant Examiner*—Colleen E Rodgers
(74) *Attorney, Agent, or Firm*—Kratz, Quintos & Hanson, LLP

(57) ABSTRACT

The present invention provides a process for forming a semiconductor film, comprising the steps of applying a semiconductor particle dispersion liquid to a substrate surface by spray coating in such a manner that the atomized droplets of the dispersion liquid discharged from the spray coater have a mean diameter of about 30 µm or less, and drying the coating to form a porous semiconductor film; and use of the semiconductor film obtained by the process.

6 Claims, No Drawings

METHOD FOR FORMING SEMICONDUCTOR FILM AND USE OF SEMICONDUCTOR FILM

TECHNICAL FIELD

The present invention relates to a process for forming a semiconductor film and use of the semiconductor film.

BACKGROUND ART

Semiconductors such as titanium oxide, due to their photocatalytic activity, have antibacterial properties, hydrophilicity, stain resistance, anti-fogging properties, gas decomposing properties, deodorizing properties, water-treating capabilities, energy conversion properties and other properties, and thus are used in a variety of fields.

In particular, photoelectric conversion devices, such as solar cells, that utilize the energy conversion properties of titanium oxide and other semiconductors are attracting attention as a means for producing electrical energy without adverse effects on the global environment.

When using titanium oxide or other semiconductors as photocatalysts, it is preferable to form them into porous films on substrates.

With regard to processes for forming a porous film of semiconductor, such as titanium oxide, Japanese Unexamined Patent Publication No. 1998-212120 discloses a process for forming a porous titanium oxide film, comprising applying a dispersion of titanium oxide particles in a glyme solvent, onto a glass, metal, ceramic or like substrate by spray coating, dip coating or like process, and then baking the coating at 200 to 800° C.

Further, Japanese Unexamined Patent Publication No. 2002-145615 discloses a process for forming a porous titanium oxide film on a substrate, comprising intermittently spraying a starting solution obtained by adding hydrogen peroxide or aluminum acetylacetonate to a titanium oxide precursor, onto a substrate such as glass maintained at a high temperature of 350° C. or 500° C. so as to thermally decompose the titanium oxide precursor to titanium oxide.

However, these processes have a drawback in that they involve heating at a high temperature of 200° C. or more to form a porous titanium oxide film, and therefore are not applicable to thermoplastic resin substrates that deform or degrade at temperatures of 200° C. or higher.

Japanese Unexamined Patent Publication No. 1999-204152 discloses a process comprising applying a dispersion of metal oxide particles in a high polymer material solution to a high polymer film provided with a conductive layer, and drying the dispersion at a temperature of 200° C. or lower.

This process employs a relatively low heating temperature, and thus is capable of forming a titanium oxide film on thermoplastic resin substrates. In this process, however, since the metal oxide particles are dispersed in a high polymer material solution, the obtained titanium oxide film has good adhesion but is unlikely to be porous. Thus, the process has a drawback in that the resulting film has inferior energy conversion properties, such as photoelectric conversion efficiency.

DISCLOSURE OF THE INVENTION

An object of the present invention is to provide a process for forming a semiconductor film that has excellent adhesion to substrates, including thermoplastic resin substrates such as high polymer films, and that has excellent photocatalytic properties such as energy conversion activity.

The present inventors conducted extensive research to achieve the above object. As a result, the inventors found that a preferable porous semiconductor film can be formed by applying a dispersion liquid of semiconductor particles to a substrate by spray coating while controlling the atomized droplets of the dispersion liquid discharged from the spray coater to have a mean diameter of 30 µm or less, thereby achieving the above object.

The present invention was accomplished by further studies based on the above novel finding.

The present invention provides the following processes for forming a semiconductor film, and use of the semiconductor films formed by these processes.

1. A process for forming a semiconductor film, comprising the steps of:

applying a semiconductor particle dispersion liquid to a substrate surface by spray coating in such a manner that the atomized droplets of the dispersion liquid discharged from the spray coater have a mean diameter of about 30 µm or less; and drying the coating to form a porous semiconductor film.

2. The process according to item 1, wherein the substrate is a thermoplastic resin substrate.

3. The process according to item 2, wherein the thermoplastic resin substrate is a high polymer film.

4. The process according to item 1, wherein the semiconductor particle dispersion liquid is a dispersion in methanol and/or ethanol of particles of at least one semiconductor selected from the group consisting of metal oxides, perovskites, metal sulfides and metal chalcogenides.

5. The process according to item 4, wherein the semiconductor particles are titanium oxide particles.

6. The process according to item 5, wherein the titanium oxide particles are anatase-type titanium oxide particles.

7. The process according to item 1, wherein the semiconductor particle dispersion liquid has a solids content of about 1 wt. % to about 40 wt. %.

8. The process according to item 1, wherein the semiconductor particle dispersion liquid has a viscosity of about 0.001 Pa·sec to about 2 Pa·sec.

9. The process according to item 1, wherein the atomized droplets of the dispersion liquid discharged from the spray coater have a mean diameter of about 1 µm to about 25 µm.

10. The process according to item 1, wherein the coating is dried by heating at a temperature of about 200° C. or less or by irradiation with electromagnetic waves.

11. The process according to item 10, wherein the electromagnetic waves are microwaves.

12. A photocatalyst comprising a porous semiconductor film formed on a substrate by the process according to item 1.

13. The photocatalyst according to item 12, wherein the porous semiconductor film is a porous titanium oxide film.

14. The photocatalyst according to item 13, wherein the porous titanium oxide film is a porous anatase-type titanium oxide film.

15. A photoelectrode for dye-sensitized solar cells, comprising a porous semiconductor film formed by the process according to item 1 on an electrically conductive transparent layer formed either on a glass plate or a transparent high polymer film.

16. A photoelectrode according to item 15, wherein the porous semiconductor film is a porous titanium oxide film.

17. A photoelectrode according to item 16, wherein the porous titanium oxide film is a porous anatase-type titanium oxide film.

Process for Forming Semiconductor Film

The process for forming a semiconductor film according to the present invention comprises the steps of applying a semiconductor particle dispersion liquid to a substrate surface by spray coating in such a manner that the atomized droplets of the dispersion liquid discharged from the spray coater have a mean diameter of about 30 μm or less, and then drying the coating to form a porous semiconductor film.

Substrate

The substrate for use in the process of the present invention is not limited and may be selected from various known substrates. Specifically, usable substrates include sheets, films, molded articles and other substrates made of thermoplastic resins; glass, metals, concrete and other inorganic substrates; etc. These substrates may be previously provided with primer coatings, electrically conductive layers or the like.

Preferable examples of glass, an inorganic substrate, include soda-lime glass, which has cost and strength advantages; and no-alkali glass, which is not degraded by alkali elution.

Preferable thermoplastic resin substrates are high polymer films. Preferable materials for high polymer films include polyethylene terephthalate, triacetyl cellulose, polyethylene naphthalate, syndiotactic polystyrene, polyphenylene sulfide, polycarbonates, polyallylates, polysulfones, polyester sulfones, polyimides, polyether imides, cyclic polyolefins, phenoxy bromide resins, silicon resins, fluororesins, acrylic resins, etc. From the viewpoint of practical use, polyethylene terephthalate films are particularly preferable as high polymer films.

The high polymer films preferably have high flexural strength and high transparency.

The high polymer films are not limited in shape and may be rectangular, square or other shapes. For instance, rolled high polymer film strips are usable. When a large-sized high polymer film or a high polymer film strip is used, the high polymer film can be cut to a desired size after being coated with the semiconductor particle dispersion liquid and dried.

With respect to the size of the polymer film, for example when a rectangular or square film is used, it is about 1 cm to about 10 m, preferably about 5 cm to about 5 m, and more preferably about 10 cm to 2 m, in terms of both length and width. When a film strip is used, its width is about 1 cm to about 10 m, preferably about 5 cm to about 5 m, and more preferably about 10 cm to about 2 m. The strip is used as rolled, and therefore, the length of the film strip is not limited. The high polymer film is preferably about 1 μm to about 10 mm thick, and more preferably about 5 μm to about 5 mm thick.

Semiconductor Particle Dispersion Liquid

The semiconductor particle dispersion liquid for use in the process of the present invention is obtained by dispersing semiconductor particles in a solvent.

The semiconductor particles are not limited and may be any known semiconductor particles. Usable semiconductors include titanium oxide, zinc oxide, manganese oxide, cadmium oxide, indium oxide, lead oxide, molybdenum oxide, tungsten oxide, antimony oxide, bismuth oxide, copper oxide, mercury oxide, silver oxide, manganese oxide, iron oxide, vanadium oxide, tin oxide, zirconium oxide, strontium oxide, gallium oxide, silicon oxide, chromium oxide and other metal oxides; $SrTiO_3$, $CaTiO_3$ and other perovskites; cadmium sulfide, zinc sulfide, indium sulfide, lead sulfide, molybdenum sulfide, tungsten sulfide, antimony sulfide, bismuth sulfide, cadmium zinc sulfide, copper sulfide and other metal sulfides; CdSe, $In_2Se_3$, $WSe_2$, HgS, PbSe, CdTe and other metal chalcogenides; and GaAs, Si, Se, $Cd_2P_3$, $Zn_2P_3$, InP, AgBr, $PbI_2$, $HgI_2$, $BiI_3$ and other semiconductors. Also usable are composites comprising at least one member selected from the above semiconductors.

Preferable semiconductor particles are titanium oxide particles, which are inexpensive and highly photocatalytic. Anatase-type titanium oxide particles are particularly preferable due to its remarkably high photocatalytic activity.

Titanium oxide particles are commercially available: commercial products include "AMT-600" (tradename of TAYCA, anatase-type, mean primary particle size: 30 nm), "AMT-100" (tradename of TAYCA, anatase-type, mean primary particle size: 6 nm), "ST-01" (tradename of Ishihara Techno, anatase-type, mean primary particle size: 7 nm), "ST-21" (tradename of Ishihara Techno, anatase-type, mean primary particle size: 20 nm), "P-25" (tradename of Nippon Aerosil, rutile-anatase type, mean primary particle size: about 30 nm), etc.

The mean primary particle size of the semiconductor particles is, for example, about 1 nm to about 1000 nm, and preferably about 5 nm to about 100 nm. When used for dye-sensitized solar cells (Graetzel cells), semiconductor particles with a mean primary particle size of less than 1 nm are not preferable, since the use of such particles leads to a semiconductor layer with a small mean pore size, making it difficult to transfer redox substances in the electrolyte solution and to adsorb the sensitizing dye. As a result, the current value after photoelectric conversion is low. Similarly, semiconductor particles with a mean particle size greater than 1,000 nm are not preferable since use of such particles leads to a semiconductor layer that has too small a surface area to support a sufficient amount of sensitizing dye, resulting in a low current value after photoelectric conversion.

The semiconductor particles are preferably dispersed in a solvent usually using a dispersing device. Usable dispersing devices include paint shakers, pebble mills, sand mills, etc. The mean particle size of the semiconductor particles after dispersion using the dispersing device is preferably about 100 nm or less.

Preferable solvents for dispersing the semiconductor particles include methanol, ethanol and mixtures thereof. In particular, when using ethanol as the solvent, a dispersion liquid with improved stability can be obtained due to the excellent affinity of ethanol to semiconductor particles. Thus, use of ethanol alone or as the main solvent is advantageous in that the resulting dispersion liquid is unlikely to cohere at the nozzle tip and clog the nozzle, even when the dispersion liquid is subjected to a high shearing force at the time of spray coating.

When necessary, water and/or an organic solvent can be used in combination with methanol and/or ethanol. Usable organic solvents include, for example, xylene, toluene, and other aromatic solvents; n-propanol, isopropanol, n-butanol, polyalkylene glycols and other alcoholic solvents; diethylene glycol, diethylene glycol monoethyl ether, diethylene glycol monobutyl ether, triethylene glycol monomethyl ether, polyoxyalkylene glycol derivatives (e.g., polyoxyethylene(10)octylphenyl ether) and other ethereal solvents; acetone, methyl ethyl ketone and other ketonic solvents; methyl acetate, ethyl acetate, propyl acetate, butyl acetate, isobutyl acetate and other ester solvents; etc.

The dispersion liquid may contain, in addition to semiconductor particles, known complexing agents (e.g., acetyl acetone), semiconductor particle precursors, etc.

The semiconductor particle dispersion liquid for use in the present invention preferably has a solids content of about 1 wt. % to about 40 wt. %, and preferably about 5 to about 30 wt. %, at the time of spray coating.

When the dispersion liquid has a solids content less than 1 wt. %, it is difficult to obtain the necessary film thickness, with the result that the obtained semiconductor film is liable to have insufficient energy conversion properties such as photoelectric conversion efficiency. Moreover, with such a solids content, the dispersion liquid as deposited by spray coating is unlikely to have an adequate solids content (usually 90 wt. % or more), making it difficult to obtain a thin semiconductor film that is porous and has good adhesion.

When the dispersion liquid has a solids content of more than 40 wt. %, the mean diameter of the atomized droplets of the dispersion liquid discharged from the spray coater is large, making it difficult to obtain a semiconductor film with excellent photoelectric conversion efficiency. Moreover, when the dispersion liquid has a high solids content, the movement of the semiconductor particles in the atomized droplets of the dispersion liquid is restricted, resulting in a reduction of semiconductor particle binding energy produced by the sharp decrease of the kinetic energy of the semiconductor particles from the start of the spraying of the dispersion liquid until the deposition on the substrate. Thus, it is difficult to obtain a thin semiconductor film with good adhesion and high strength.

The semiconductor particle dispersion liquid preferably has a viscosity of about 0.001 Pa·sec to about 2 Pa·sec, and more preferably about 0.001 Pa·sec to about 1 Pa·sec.

When the viscosity is less than 0.001 Pa·sec, the dispersion liquid is imparted with only a low energy by spraying, and therefore the semiconductor particles have a low initial energy, making it difficult to obtain a thin semiconductor film with good adhesion. When the dispersion liquid has a viscosity of more than 2 Pa·sec, it is difficult to atomize the dispersion liquid into droplets with a mean diameter of about 30 μm or less, resulting in difficulties in forming a thin semiconductor film with good adhesion.

Spray Coating and Drying of the Coating

Examples of spray coaters usable in the process of the present invention include electrostatic spray coaters, non-electrostatic spray coaters, rotary spray coaters, magnetic spray coaters, ultrasonic atomizers and other known spray coaters. Electrostatic spray coaters and ultrasonic atomizers are particularly preferable.

Various nozzles are usable for such coaters, with two-fluid spray nozzles and other nozzles that can form atomized droplets with a narrow particle size distribution being preferable.

In the process of the present invention, it is essential that the atomized droplets of the dispersion liquid of semiconductor particles discharged from the spray coater have a mean diameter of about 30 μm or less. When the atomized droplets of the dispersion liquid have a mean diameter of more than 30 μm, it is likely that the dispersed particles clog the nozzle tip or that the atomized droplets of the dispersion liquid deposited on the substrate surface unevenly agglomerate, failing to form a desirable porous film. As a result, it is difficult to obtain a semiconductor film with good adhesion to the substrate and high photoelectric conversion efficiency. Further, when the atomized droplets of the dispersion liquid have a large mean diameter, the solvent volatilizes only slowly, and thus the dispersion liquid deposited on the substrate is unlikely to have an adequate solids content (usually 90 wt. % or more), and the kinetic energy of the semiconductor particles in the atomized droplets does not sharply decrease. As a result, it is difficult to obtain a porous film with good adhesion and high strength.

Preferably, the atomized droplets of the dispersion liquid have a mean diameter of about 1 μm to about 25 μm, and more preferably about 1 μm to about 20 μm.

In this specification and the appended claims, the mean diameter of the atomized droplets of the semiconductor particle dispersion liquid discharged from the spray coater is measured using a "2600 Particle Sizer" (tradename of Malvern, US).

The mean diameter of the atomized droplets of the semiconductor particle dispersion liquid can be controlled to about 30 μm or less by adjusting spraying conditions such as nozzle type, atomization air pressure, pattern width, discharge amount, discharge pressure, coating speed, number of stages (number of coating applications), nozzle-substrate distance, etc. Optimal conditions vary depending on the type of the coater used. Thus, suitable conditions are selected according to the type of coater to be used, to form atomized droplets with the above specified mean diameter.

Examples of suitable coating conditions are as follows: an atomization air pressure of 0.5 to 5.0 kgf/cm$^2$ and preferably 1.0 to 3.0 kgf/cm$^2$; a discharge amount of 1 to 500 g/min and preferably 10 to 100 g/min; a nozzle-substrate distance of 5 to 100 cm and preferably 10 to 50 cm; a coating speed of 1 to 200 m/min and preferably 10 to 100 m/min; a stage number of 1 to 100 and preferably 1 to 10.

Since the dispersion liquid of semiconductor particles is applied by spray coating while controlling the atomized droplets of the dispersion liquid to have a mean diameter of 30 μm or less, the process of the present invention is capable of forming a porous semiconductor film that has a larger mean pore size and thus a larger specific surface area than films formed by other coating processes such as roller coating. The mean pore size and specific surface area can be measured by, for example, according to JIS R 1625.

In the process of the present invention, the semiconductor particle dispersion liquid is sprayed onto the substrate, and the wet coating layer is dried to form a porous semiconductor film.

The wet coating layer of the semiconductor particle dispersion liquid can be dried by allowing to stand at room temperature, heating, irradiation with electromagnetic waves, or other methods.

Heating can be performed using an electric furnace, gas furnace or like device. The heating conditions can be suitably adjusted according to the type of substrate.

For example, when using an inorganic substrate such as a glass plate, the wet coating layer can be dried and sintered by heating at a temperature of 200° C. or higher, and preferably about 300° C. to about 700° C. Suitable heating times vary depending on the heating temperature, and are usually about 10 minutes to about 3 hours.

When using a thermoplastic resin substrate such as a high polymer film, to avoid deformation and degradation of the substrate, the wet coating layer is preferably heated and dried at a temperature of about 200° C. or lower, and more preferably about 130° C. to about 180° C. The suitable heating time is usually about 10 minutes to about 3 hours.

Electromagnetic waves usable for drying are not limited as long as they are capable of imparting energy to the semiconductor particles, and include, for example, ultraviolet rays, visible rays, infrared rays, ultrasonic waves, plasma discharges, corona discharges, microwaves, etc. Preferable electromagnetic waves include ultraviolet rays, visible rays, infrared rays and microwaves.

Ultraviolet rays, visible rays, infrared rays (e.g., far-infrared rays and near-infrared rays) and ultrasonic waves can be obtained from xenon lamps, halogen lamps, tungsten lamps, Nernst lamps, Globar lamps, mercury lamps, fluorescent lamps and other lamps; LEDs; ArF excimer lasers, KrF excimer lasers, XeCl excimer lasers, Nd:YAG lasers and other lasers; synchrotron radiation; sunlight; etc. Microwaves can be obtained from magnetron devices or the like.

When electromagnetic irradiation is employed for drying, it may be performed in combination with heating. The semiconductor particle layer may further contain semiconductor particle precursors. Further, to remove unnecessary organic or other matter during drying, the drying may be performed under reduced pressure, under a blown stream of air, oxygen, nitrogen, an inert gas or other gas, or in an ozone atmosphere, an oxidizing atmosphere, a reducing atmosphere or like atmosphere, etc.

In drying by microwave irradiation, the semiconductor particles can be sintered by selectively imparting energy to the semiconductor particles utilizing dielectric loss. Therefore, microwave drying is more advantageous than thermal sintering in an electric furnace or like device, in that microwave heating is substantially free from heat losses by heat transfer to the substrate or thermal degradation of the substrate, and can be performed in a short period of time. Thus, microwave drying is suitable when the substrate is made of a thermoplastic resin.

In microwave drying and sintering, the dielectric constant varies depending on the composition (e.g., type of dispersion medium; type, properties, particle size and shape of the semiconductor particles; solids content, etc.) of the semiconductor particle dispersion liquid. Thus, suitable conditions, such as microwave radiation frequency, microwave power, and irradiation time, can be selected according to the composition.

Suitable conditions for microwave irradiation are selected according to the type of the semiconductor particle dispersion liquid, and usually as follows: a frequency of about 300 MHz to about 300 GHz, preferably about 600 MHz to about 200 GHz, and more preferably about 1 GHz to about 100 GHz; an output of 0.01 kW to about 10 kW, preferably about 0.1 kW to about 5 kW, and more preferably about 0.2 kW to about 1.0 kW; and an irradiation time of about 1 second to about 60 minutes, preferably about 2 seconds to about 30 minutes, and more preferably about 30 seconds to about 20 minutes.

Usable microwave devices include, for example, an electromagnetic wave thermal sintering device manufactured by Fujidenpa Kogyo Co., Ltd. (tradename "FMS-10-28", frequency: 28 GHz, output: 1 to 10 kW).

This microwave device emits microwaves with a frequency of 28 GHz and a wavelength of 10.7 cm, which are shorter in wavelength than microwaves generated by household microwave ovens (frequency: 2.45 GHz, wavelength: 12 cm). Accordingly, the device is advantageous in that it can uniformly heat the coating layer to form a homogeneous semiconductor film, and that, even when used at a high output, does not cause sparking at the edge or other portions of the coating. Therefore, the device is especially suitable for sintering semiconductor particles on the surface of a high polymer film with a large area.

When using the microwaves to sinter semiconductor particles applied on a high polymer film such as a polyethylene terephthalate film with a relatively low melting point, the sintering temperature is preferably a temperature at which polyethylene terephthalate does not deform or degrade. An example of such a temperature is 200° C. or less, in particular about 130° C. to about 180° C.

Further, before microwave sintering, the back of the high polymer film (the side opposite to the side to be provided with the semiconductor film) may be provided with a plate with a high thermal conductivity, such as a plate of iron, stainless steel, copper or like metal, or a glass plate or like inorganic radiator plate, to release heat from the high polymer film.

When the semiconductor coating formed on the high polymer film surface has a large area, microwaves are likely to unevenly sinter the semiconductor particles. Uniform sintering can be achieved by, for example, the following methods:

(1) Partial irradiation of the semiconductor coating layer with microwaves is repeated several times as required so that finally the whole surface of the coating is irradiated, to thereby dissipate the heat generated by irradiation.

(2) The high polymer film surface is partially coated with the semiconductor particle dispersion liquid so as to form a striped pattern, in order to prevent unnecessary heat generation.

(3) A high polymer film strip coated with the semiconductor particle dispersion liquid is moved with the dispersion liquid-coated surface being positioned perpendicularly to the direction of the microwave irradiation.

When the high polymer film is provided with electrodes, the electrodes are masked with a polyimide film or like highly heat-resistant film, and the non-masked portion is coated with the semiconductor particle dispersion liquid, and then the resulting coating is irradiated with microwaves for sintering.

Before partially or wholly irradiating the semiconductor particle dispersion liquid layer formed on the high polymer film surface with microwaves for sintering, a plate made of glass, tetrafluoroethylene or like material that transmits microwaves may as required be provided above the semiconductor particle coating layer, to thereby prevent sparks or like problems. Further, to achieve uniform heating, the high polymer film is preferably pressed against and closely contacted with the worktable to thereby transfer excess heat generated by the microwave sintering to the worktable.

This drying step forms a porous semiconductor film on the substrate. The thickness of the porous semiconductor film can be suitably selected according to the intended use, and is usually about 1 μm to about 100 μm, and preferably about 2 μm to about 50 μm.

Use of the Semiconductor Film Formed by the Process of the Present Invention

The porous semiconductor film formed on the substrate by the process of the present invention has high adhesion, high strength and other excellent properties. When formed using a semiconductor with photocatalytic properties, such as titanium oxide, the film is useful as a photocatalyst, a photoelectrode for dye-sensitized solar cells, etc.

Photocatalyst

A photocatalyst comprising a porous film of titanium oxide or like semiconductor formed on a substrate by the process of the present invention has excellent properties such as antibacterial properties, hydrophilicity, stain resistance, anti-fogging properties, gas decomposing properties, deodorizing properties, water-treating capabilities, energy conversion properties, etc. The porous semiconductor film is preferably a porous titanium oxide film, and more preferably a porous anatase-type titanium oxide film, in view of its excellent photocatalytic activity.

The photocatalyst of the present invention can be suitably used in the fields of, for example, atmospheric purification, water purification, hydrophilization, antibacterial treatment, deodorization treatment, anti-fogging treatment, wastewater treatment, energy conversion, etc.

Photoelectrode for Dye-Sensitized Solar Cells

The photocatalyst of the present invention can be suitably used in the field of energy conversion, and in particular, as a photoelectrode for dye-sensitized solar cells.

That is, the present invention also provides a photoelectrode for dye-sensitized solar cells that comprises a porous semiconductor film formed by the process of the present invention on an electrically conductive transparent layer provided on a glass plate or a transparent high polymer film. The photoelectrode is a laminate of a glass plate or a transparent high polymer film, an electrically conductive transparent layer, and a porous semiconductor film, superposed in that order.

From the viewpoint of photoelectrode performance, the porous semiconductor film is preferably a porous titanium oxide film, and more preferably a porous anatase-type titanium oxide film.

Generally, a dye-sensitized solar cell comprises a photoelectrode comprising a transparent substrate (e.g., a glass plate or a high polymer film) and, on one side of the substrate, an electrically conductive transparent layer and a semiconductor layer; a counter electrode facing the semiconductor layer; and an electrolyte sandwiched between the electrodes.

The semiconductor layer is usually a porous film that is made of semiconductor particles and has a large mean pore size, and supports a photosensitizing dye on the particle surfaces or in the pores.

The electrically conductive transparent layer is formed on the surface of a glass plate, a high polymer film or like transparent substrate by vapor-depositing gold, silver, aluminum, indium, indium tin oxide (ITO), tin oxide or the like, and usually has a thickness of about 0.01 µm to about 500 µm, and preferably about 0.1 µm to about 100 µm.

The porous semiconductor film formed by the process of the present invention is used as the semiconductor layer. The porous semiconductor film is usually about 1 µm to about 100 µm thick, and preferably about 2 µm to about 50 µm thick.

The photosensitizing dye can be selected from various known dyes that absorb light in the visible region and/or the infrared region of the spectrum.

Examples of photosensitizing dyes include azo dyes, quinone dyes, quinoneimine dyes, quinacridone dyes, squarylium dyes, cyanine dyes, merocyanine dyes, triphenylmethane dyes, xanthene dyes, porphyrin dyes, phthalocyanine dyes, perylene dyes, indigo dyes, naphthalocyanine dyes, etc. Among these, phthalocyanine dyes and naphthalocyanine dyes have a high quantum yield and high durability against light, and therefore are preferable as photoelectric conversion materials.

Examples of metals to be combined with the photosensitizing dye include copper, nickel, iron, cobalt, vanadium, tin, silicon, titanium, germanium, cobalt, zinc, ruthenium, magnesium, aluminum, lead, manganese, indium, molybdenum, zirconium, antimony, tungsten, platinum, bismuth, selenium, silver, cadmium, platinum, etc. Among these, copper, titanium, zinc, aluminum, iron, vanadium and silicon are preferable since metal complex dyes comprising these metals have a high quantum efficiency.

The amount of the photosensitizing dye to be supported by the semiconductor particles is preferably about $10^{-8}$ mol/cm$^2$ to about $10^{-6}$ mol/cm$^2$, and more preferably about 0.1 to $9.0 \times 10^{-7}$ mol/cm$^2$. Less than $10^{-8}$ mol/cm$^2$ of photosensitizing dye does not sufficiently improve the photoelectric conversion efficiency. More than $10^{-6}$ mol/cm$^2$ of photosensitizing dye does not further improve the photoelectric conversion efficiency, and thus is uneconomical.

The electrolyte used in the electrolyte layer is not limited as long as it comprises a redox pair in a solvent. Preferably, the redox pair consists of an oxidant and reductant with the same electric charge. The redox pair is a pair of substances that reversibly exist in an oxidized or reduced form in an oxidation-reduction reaction system. Redox pairs are well known to persons of ordinary skill in the art.

Examples of redox pairs include chlorine compound-chlorine, iodine compound-iodine, bromine compound-bromine, thallium ion (III)-thallium ion (I), mercury ion (II)-mercury ion (I), ruthenium ion (III)-ruthenium ion (II), copper ion (II)-copper ion (I), iron ion (III)-iron ion (II), vanadium ion (III)-vanadium ion (II), manganic acid ion-permanganic acid ion, ferricyanide-ferrocyanide, quinone-hydroquinone, fumaric acid-succinic acid, etc. Other redox pairs are also usable.

Among the above redox pairs, iodine compound-iodine is preferable. Preferable iodine compounds include lithium iodide, potassium iodide, copper iodide, silver rubidium iodide and other metal iodides; tetraalkylammonium iodine, pyridinium iodine and other quaternary ammonium iodide salt compounds; dimethylpropylimidazolium iodide and other diimidazolium iodide compounds; etc.

The solvent to be used for dissolving the electrolyte is preferably a compound that dissolves the redox pair and has high ionic conductivity. Water and/or an organic solvent can be used as a solvent. Preferably, an organic solvent is used in order to stabilize the redox pair.

Specific examples of organic solvents include dimethyl carbonate, diethyl carbonate, methyl ethyl carbonate, ethylene carbonate, propylene carbonate and other carbonate compounds; methyl acetate, methyl propionate, γ-butyrolactone and other ester compounds; diethyl ether, 1,2-dimethoxyethane, 1,3-dioxolane, tetrahydrofuran, 2-methyltetrahydrofuran and other ether compounds; 3-methyl-2-oxazolidine, 2-methylpyrrolidone and other heterocyclic compounds; acetonitrile, methoxyacetonitrile, propionitrile and other nitrile compounds; sulfolane, dimethylsulfoxide, dimethylformamide and other aprotic polar compounds; etc. Such solvents may be used singly or in combination. Especially preferable solvents include ethylene carbonate, propylene carbonate and other carbonate compounds; 3-methyl-2-oxazolidine, 2-methylpyrrolidone and other heterocyclic compounds; and acetonitrile, methoxyacetonitrile, propionitrile and other nitrile compounds.

The electrolyte may be in the form of a liquid, solid or gel.

An adhesive layer may be provided outside the counter electrode of the dye-sensitized solar cell comprising a photoelectrode that comprises a transparent substrate (e.g., a glass plate or high polymer film) provided on one side with an electrically conductive transparent layer and semiconductor layer; an electrolyte; and a counter electrode facing the semiconductor layer.

An adhesive layer makes the solar cell attachable to various articles.

The solar cell can be preferably attached to, for example, vehicles, buildings, constructions, roads, traffic signs, greenhouses and other structures that are likely to be exposed to sunlight.

The solar cell may be attached to a plastic plate, metal plate or like item by bringing the surface of the adhesive layer into contact with the item, followed by compression optionally with heating, to thereby bond the solar cell to the item. An item with a solar cell bonded thereto can be formed into a module by molding, cutting and/or other processes as required, followed where necessary by sealing of the cut portions.

When the solar cell is intended to be cut, a solid or gel electrolyte is used therein.

Examples of adhesives usable in the adhesive layer include known pressure-sensitive adhesives, heat-sensitive adhesives, curable adhesives, etc. Specific examples include thermosetting and thermoplastic adhesives comprising at least one member selected from the group consisting of bisphenol-type epoxy resins, resol-type epoxy resins, acrylic resins, aminoplast resins, polyester resins, urethane resins, polysiloxane resins, butylene resins, isobutylene resins, vinyl acetate resins, vinyl chloride resins, vinyl chloride/vinyl acetate copolymers, synthetic rubbers, natural rubbers, etc.

The adhesive layer is preferably 1 μm to 1 mm thick, and more preferably 5 μm to 500 mm thick.

The process of the present invention, in which a semiconductor particle dispersion liquid is applied to a substrate by spray coating in such a manner that the atomized droplets of the dispersion liquid have a mean diameter of about 30 μm or less, has the following advantages:

(1) After application of the dispersion liquid, semiconductor particles or aggregates thereof remain on the substrate and form a porous film that has excellent adhesion to the substrate and high strength.

Such a porous film can be formed presumably because the semiconductor particles have an increased binding energy due to the rapid decrease of their kinetic energy from the start of the spraying to the deposition to the substrate.

(2) When the solvent of the semiconductor particle dispersion liquid consists only or mainly of ethanol, the dispersion liquid is stable because of the high affinity of ethanol to the semiconductor particles. Therefore, the dispersion liquid, even when being subjected to a high shear stress at the time of spray coating, is unlikely to cohere at the nozzle tip and thereby clog the nozzle.

Further, the high affinity of ethanol facilitates necking of the coating film formed from the semiconductor particle dispersion liquid, and thus even when the dispersion liquid is applied to a flexible substrate such as a high polymer film, it does not peel off when the substrate flexes.

(3) Since the solvent partially evaporates from the dispersion liquid during spray coating, the semiconductor particles being sprayed are stabilized.

(4) In prior art techniques, a semiconductor particle dispersion liquid is applied to an inorganic substrate such as a glass plate, and sintered at 200° C. or higher to form a porous semiconductor film. In contrast, the process of the present invention is capable of forming a porous semiconductor film at low temperatures not higher than 200° C., and therefore can be carried out using a thermoplastic resin substrate such as a high polymer film.

(5) By microwave sintering of the semiconductor particle dispersion liquid applied to a high polymer film substrate such as a polyethylene terephthalate, a porous film can be formed in which the semiconductor particles are uniformly sintered, even when the film has a large area.

(6) The process is capable of forming, on a substrate, a porous film of a semiconductor with photocatalytic activities, such as titanium oxide, to obtain a photocatalyst or photoelectrode for dye-sensitized solar cells with excellent performance.

BEST MODE FOR CARRYING OUT THE INVENTION

The following Production Examples, Examples and Comparative Examples are given to illustrate the present invention in further detail, and are not intended to limit the scope of the invention. In these examples, parts and percentages are all by weight.

PRODUCTION EXAMPLE 1

Thirty parts of "P-25" (tradename of Japan Aerosil Co., Ltd., rutile-anatase-type titanium oxide ($TiO_2$) crystals, mean primary particle size: 30 nm) and 120 parts of ethanol were agitated with glass beads in a paint shaker for 6 hours, to thereby obtain a dispersion liquid of titanium oxide particles. The dispersion liquid had a viscosity of 1 Pa·sec.

Example 1

(i) A polyethylene terephthalate (PET) film (100 cm long, 30 cm wide and 1 mm thick) was spray-coated with the above titanium oxide particle dispersion liquid using a spray coater in which the dispersion liquid was pumped through a two-fluid spray nozzle (tradename "Atomax Nozzle (Model AM25S)", manufactured by Atomax Co., Ltd.), under the coating conditions presented in Table 1. The mean diameter of the atomized droplets of the dispersion liquid discharged from the spray coater was 19.7 μm.

The resulting coating was dried in an electric furnace at 150° C. for 30 minutes, to thereby obtain a 8 μm thick porous titanium oxide film.

The mean pore size of the porous titanium oxide film was measured by the method described below, and found to be 14.9 nm, demonstrating that a preferable porous film with a large pore size was formed.

Method of measuring the mean pore size: The PET film with the 8 μm thick porous titanium oxide film obtained above was cut into strips (5 mm×25 mm), and sixty of the strips were inserted into a glass cell of "MICROMERITICS ASAP2010" (tradename of Shimadzu Corp., pore size distribution measuring apparatus utilizing nitrogen adsorption/desorption) to measure the mean pore size.

(ii) An 8 μm thick porous titanium oxide film was obtained in the same manner as in (i) except using as a substrate an electrically conductive PET film on which a 1 μm thick ITO electrically conductive transparent layer had been vapor-deposited.

The substrate with the porous film was immersed at room temperature overnight in an ethanol solution containing a sensitizing dye [Ru(2,2'-bipyridil-4,4'-dicarboxylate(TBA))$_2$ (NCS)] at a concentration of $5 \times 10^{-4}$ M/L to obtain a photoelectrode. The above-mentioned electrically conductive PET film sputtered with platinum was superimposed as the counter electrode on the sensitizing dye-adsorbing porous titanium oxide film of the photoelectrode.

An electrolyte solution (40 mM iodine, 500 mM tetrapropylammonium iodine, 80 M ethylene carbonate and 20 M acetonitrile) was poured between the titanium oxide film of the photoelectrode and the counter electrode, to obtain a dye-sensitized solar cell.

Example 2

(i) Spray coating was performed in the same manner as in Example 1 (i) except for employing the coating conditions shown in Table 1. The mean diameter of the atomized droplets of the dispersion liquid discharged from the spray coater was 24.3 μm.

The resulting coating was dried in an electric furnace at 150° C. for 30 minutes, to thereby obtain a 9 μm thick porous titanium oxide film.

The mean pore size of the porous titanium oxide film was measured in the same manner as in Example 1 (i) and found to be 14.5 nm, demonstrating that a preferable porous film with a large pore size was formed.

(ii) A dye-sensitized solar cell was obtained in the same manner as in Example 1 (ii) except for employing the coating conditions shown in Table 1 and forming a 9 μm thick porous titanium oxide film.

Example 3

(i) Spray coating was performed in the same manner as in Example 1 (i) except for employing the coating conditions shown in Table 1. The mean diameter of the atomized droplets of the dispersion liquid discharged from the spray coater was 19.5 μm.

The resulting coating was irradiated with microwaves using an electromagnetic wave thermal sintering apparatus (tradename "FMS-10-28", manufactured by Fujidenpa Kogyo Co., Ltd.) at a frequency of 28 GHz, an output of 2 kW and an irradiation time of 2 minutes, to thereby obtain a 9 μm thick sintered porous titanium oxide film.

The mean pore size of the porous titanium oxide film was measured in the same manner as in Example 1 (i) and found to be 15.5 nm, demonstrating that a preferable porous film with a large pore size was formed.

(ii) Spray coating was performed under the coating conditions shown in Table 1 and the coating was irradiated with microwaves in the same manner as above, to thereby obtain a 9 μm thick porous titanium oxide film. Using the obtained substrate with the film, a dye-sensitized solar cell was produced in the same manner as in Example 1 (ii).

Comparative Example 1

The titanium oxide particle dispersion liquid obtained in Production Example 1 was applied with a knife coater to a PET film (100 cm long, 30 cm wide and 1 mm thick).

The resulting coating was dried in an electric furnace at 150° C. for 30 minutes, to thereby obtain a 8 μm thick porous titanium oxide film.

The mean pore size of the porous titanium oxide film was measured in the same manner as in Example 1 (i) and found to be 9.5 nm, demonstrating that an inferior porous film with a small pore size was formed.

Comparative Example 2

Spray coating was carried out in the same manner as in Example 1 (i) except for employing the coating conditions shown in Table 1. The mean diameter of the atomized droplets of the dispersion liquid discharged from the spray coater was 41.4 μm.

The resulting coating was dried in an electric furnace at 150° C. for 30 minutes, to thereby obtain a 10 μm thick porous titanium oxide film.

The mean pore size of the porous titanium oxide film was measured in the same manner as in Example 1 (i) and found to be 10.5 nm, demonstrating that an inferior porous film with a small mean pore size was formed.

Table 1 presents the spray coating conditions employed in Examples 1 to 3 and Comparative Example 2.

TABLE 1

|  | Ex. 1 | Ex. 2 | Ex. 3 | Comp. Ex. 2 |
|---|---|---|---|---|
| Discharged amount (g/min) | 60 | 60 | 60 | 60 |
| Atomization air pressure (kgf/cm²) | 3.0 | 2.0 | 2.0 | 1.0 |
| Number of stages | 3 | 3 | 3 | 3 |
| Nozzle-substrate distance (mm) | 20 | 20 | 20 | 20 |
| Coating rate (m/min) | 60 | 60 | 60 | 60 |

The porous titanium oxide films obtained in Example 1 (i), Example 2 (i), Example 3 (i), and Comparative Examples 1 and 2 were tested for adhesion and scratch resistance. Further, the photoelectric conversion efficiency of the dye-sensitized solar cells obtained in Example 1 (ii), Example 2 (ii) and Example 3 (ii) was measured. The test methods are as follows.

Adhesion: The adhesion of the porous titanium oxide films to the PET film was tested by a bending test. A porous film that did not peel off even when the PET film with the porous film formed thereon was sharply bent or forcefully hit was evaluated as having good adhesion, while a porous film that peeled off when the PET film with the porous film was bent was evaluated as having poor adhesion.

Film scratch resistance (gf): Porous titanium oxide films were formed in the same manner as in the Examples and Comparative Examples except for using, as the substrate, a glass plate in place of the PET film, and used as test samples.

Using a "Tribogear Type 18L" (tradename of Shinto Scientific Co., Ltd., continuous load scratch resistance tester), the load at which the glass plate was uncovered was found by applying a vertical load of 0 to 100 g to a scratch needle (made of sapphire, 1.2 mm in diameter) and moving the needle at a rate of 600 mm/min over a distance of 100 mm. The greater the load, the higher the film strength. A load of 10 gf or more is particularly preferable.

Photoelectric conversion efficiency (%): The dye-sensitized solar cells were irradiated with artificial sunlight (xenon lamp) (AM1.5, unit: 100 mW/cm²) to measure the photoelectric conversion efficiency.

Table 2 shows the test results.

TABLE 2

|  | Ex. 1 | Ex. 2 | Ex. 3 | Comp. Ex. 1 | Comp. Ex. 2 |
|---|---|---|---|---|---|
| Adhesion | Good | Good | Good | Poor | Poor |
| Scratch resistance | 14.1 | 12.6 | 12.6 | 6.1 | 7.3 |
| Photoelectric conversion efficiency | 2.1 | 1.6 | 2.8 | — | — |

The invention claimed is:

1. A photoelectrode for dye-sensitized solar cells, comprising a porous titanium oxide film formed on an electrically conductive transparent layer formed on a transparent high polymer film, the porous titanium oxide film being obtained by a process comprising the steps of:

applying a titanium oxide particle dispersion liquid in methanol and/or ethanol to the surface of the electrically conductive transparent layer by spray coating in such a manner that the atomized droplets of the dispersion liquid discharged from the spray coater have a mean diameter of about 1 μm to about 25 μm; and drying the coating by heating at a temperature of about 130° C. to about 180° C. or by irradiation with electromagnetic waves to form a porous titanium oxide film.

2. The photoelectrode according to claim 1, wherein the porous titanium oxide film is a porous anatase-type titanium oxide film.

3. The photoelectrode according to claim 1, wherein the titanium oxide particle is anatase-type titanium oxide particle.

4. The photoelectrode according to claim 1, wherein the titanium oxide particle dispersion liquid has a solids content of about 1 wt. % to about 40 wt. %.

5. The photoelectrode according to claim 1, wherein the titanium oxide particle dispersion liquid has a viscosity of about 0.001 Pa·sec to about 2 Pa·sec.

6. The photoelectrode according to claim 1, wherein the coating is dried by microwave irradiation.

* * * * *